United States Patent
Kim et al.

(10) Patent No.: US 8,409,923 B2
(45) Date of Patent: Apr. 2, 2013

(54) INTEGRATED CIRCUIT PACKAGING SYSTEM WITH UNDERFILL AND METHOD OF MANUFACTURE THEREOF

(75) Inventors: Oh Han Kim, Ichon-si (KR); Yong Hee Kang, Ansan-si (KR); DaeSik Choi, Seoul (KR)

(73) Assignee: STATS Chippac Ltd., Singapore (SG)

( * ) Notice: Subject to any disclaimer, the term of this patent is extended or adjusted under 35 U.S.C. 154(b) by 70 days.

(21) Appl. No.: 13/161,368

(22) Filed: Jun. 15, 2011

(65) Prior Publication Data

US 2012/0319300 A1 Dec. 20, 2012

(51) Int. Cl.
*H01L 21/00* (2006.01)

(52) U.S. Cl. ............... 438/109; 257/E23.141; 257/685; 257/777; 438/108; 438/125

(58) Field of Classification Search ........... 257/E25.018, 257/E25.013, E23.141, 685, 686, 701, 704, 257/723, 737, 738, 777, 778, 783, 786; 438/108, 438/109, 125, 127, 612
See application file for complete search history.

(56) References Cited

U.S. PATENT DOCUMENTS

| | | | | |
|---|---|---|---|---|
| 5,838,061 | A | * | 11/1998 | Kim .............................. 257/686 |
| 6,031,284 | A | * | 2/2000 | Song ............................ 257/701 |
| 6,172,423 | B1 | * | 1/2001 | Lee ............................... 257/780 |
| 6,400,036 | B1 | * | 6/2002 | Tang et al. .................... 257/780 |
| 6,407,448 | B2 | * | 6/2002 | Chun ............................ 257/678 |
| 6,630,730 | B2 | | 10/2003 | Grigg |
| 6,906,407 | B2 | * | 6/2005 | Byers et al. .................. 257/686 |
| 6,939,746 | B2 | * | 9/2005 | Bolken ......................... 438/127 |
| 7,279,366 | B2 | | 10/2007 | Bolken |
| 7,550,680 | B2 | | 6/2009 | Pendse |
| 7,829,991 | B2 | * | 11/2010 | Moden et al. ................ 257/686 |
| 2007/0273019 | A1 | | 11/2007 | Huang et al. |
| 2009/0032928 | A1 | * | 2/2009 | Chiang et al. ................ 257/686 |
| 2009/0146301 | A1 | * | 6/2009 | Shimizu et al. .............. 257/738 |
| 2011/0186998 | A1 | * | 8/2011 | Wu et al. ...................... 257/738 |

* cited by examiner

*Primary Examiner* — Chris Chu
(74) *Attorney, Agent, or Firm* — Ishimaru & Associates LLP

(57) ABSTRACT

A method of manufacture of an integrated circuit packaging system includes: providing a substrate with a projection formed along a perimeter of a first surface of the substrate; mounting an integrated circuit over the first surface; forming a protruding interconnect over the first surface between the projection and the integrated circuit; and forming an underfill between the integrated circuit and the projection with a uniform height, the uniform height of the underfill less than a height of the projection.

20 Claims, 5 Drawing Sheets

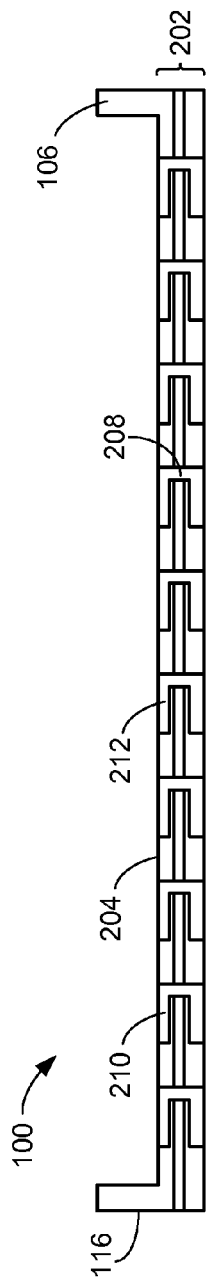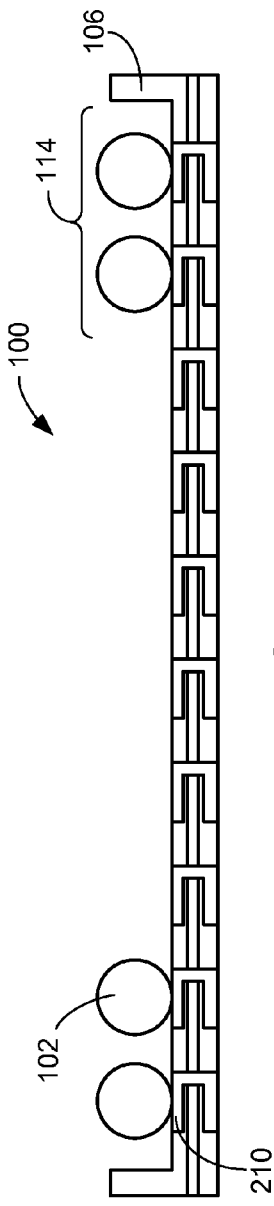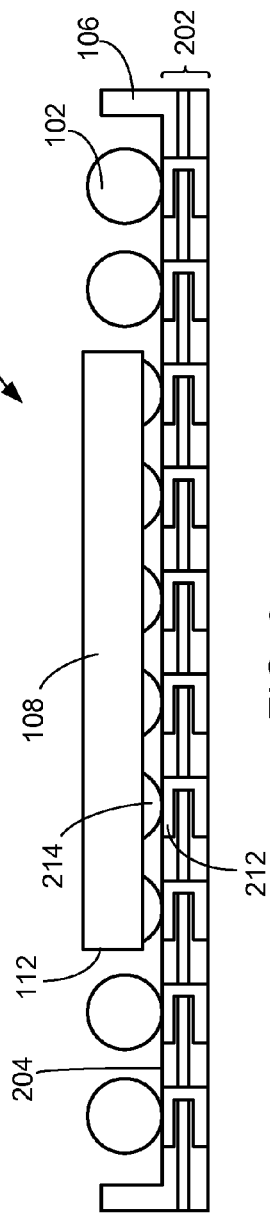

INTEGRATED CIRCUIT PACKAGING SYSTEM WITH UNDERFILL AND METHOD OF MANUFACTURE THEREOF

TECHNICAL FIELD

The present invention relates generally to an integrated circuit packaging system, and more particularly to a system for an underfill structure and application within an integrated circuit packaging system.

BACKGROUND ART

Integrated circuits and integrated circuit packaging systems can be found in a multitude of portable electronic devices, such as smart phones, pocket PCs, digital cameras, location based devices, and other wireless products. Today's customers and electronics systems are demanding the functional integration of memory and logic within the smallest footprint, lowest profile, and lowest cost package available. Consequently, manufacturer's are turning to three-dimensional packaging to achieve the required high level of functional integration necessary to support these mobile multimedia products.

Integrated circuit packaging systems continue to advance toward miniaturization by vertically stacking packages in package-on-package configurations to increase the density of the components while decreasing the sizes of the products that are made therefrom.

However, vertically stacked packages have their own problems, such as, local and global planarization inconsistencies, which makes the package-to-package stacking assembly process difficult due to the irregularities in the flatness or planarity of the packages.

Thus, a need still remains for a reliable integrated circuit packaging system and method of fabrication, wherein the integrated circuit packaging system provides a simplified process flow for minimizing substrate and package warpage problems in stacked package configurations. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate with a projection formed along a perimeter of a first surface of the substrate; mounting an integrated circuit over the first surface; forming a protruding interconnect over the first surface between the projection and the integrated circuit; and forming an underfill between the integrated circuit and the projection with a uniform height, the uniform height of the underfill less than a height of the projection.

The present invention provides an integrated circuit packaging system, including: a substrate with a projection along a perimeter of a first surface of the substrate; an integrated circuit over the first surface of the substrate and attached thereto; a protruding interconnect over the first surface between the projection and the integrated circuit; and an underfill between the integrated circuit and the projection with a uniform height, the uniform height of the underfill less than a height of the projection.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 4 is a cross-sectional view of an integrated circuit packaging system in an initial stage of manufacture.

FIG. 5 is a cross-sectional view of the integrated circuit packaging system of FIG. 4 after adhering the protruding interconnect.

FIG. 6 is a cross-sectional view of the integrated circuit packaging system of FIG. 5 after adhering the integrated circuit.

BEST MODE FOR CARRYING OUT THE INVENTION

Figure 1:
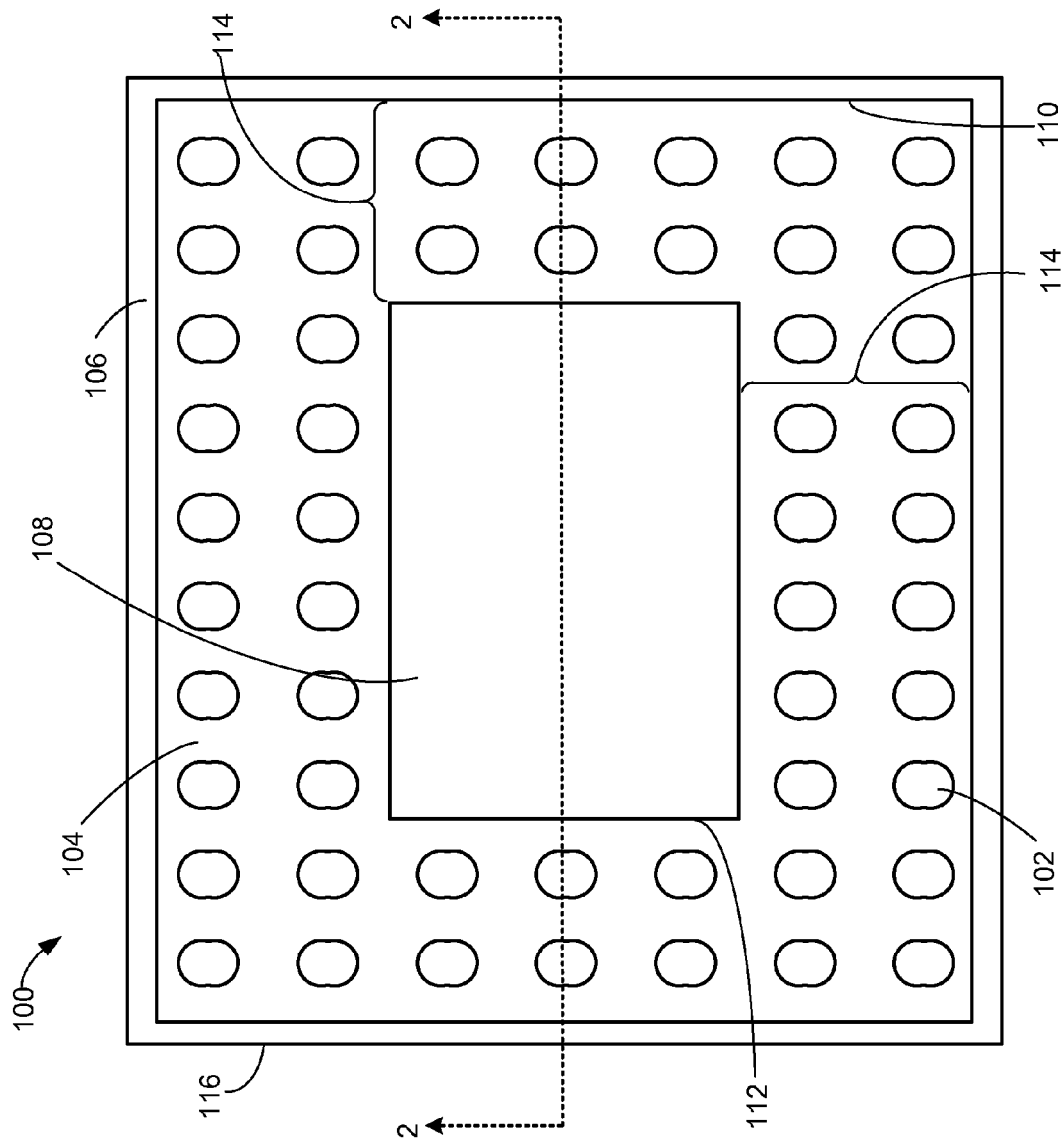
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the first side plane or top surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct protruding interconnect between elements.

The term "processing" as used herein includes deposition of material or photoresist, patterning, exposure, development, etching, cleaning, and/or removal of the material or photoresist as required in forming a described structure.

The terms "first" and "second" as used herein are for purposes of differentiation between elements only and are not to be construed as limiting the scope of the present invention.

The term "underfill" is used herein to mean a material whose largest particle size is less than a quarter of the standoff height between the integrated circuit and the substrate.

Referring now to FIG. 1, therein is shown a top view of an integrated circuit packaging system 100 in a first embodiment of the present invention. In at least one embodiment, the integrated circuit packaging system 100 can include a bottom package, a base package, or a first package. In such cases, the integrated circuit packaging system 100 can be utilized within a package-on-package (PoP) configuration or packaged as a separate and discrete element. PoP refers to a 3D package in which fully tested packages are stacked on top of another single or stacked package during the board mount process. The integrated circuit packaging system 100 can provide electrical access to electrical circuits formed above and below the integrated circuit packaging system 100.

In at least one embodiment, the integrated circuit packaging system 100 is depicted as square in shape; however, it is not limited to such shape and can include any rectilinear or curvilinear shape.

The integrated circuit packaging system 100 can include a protruding interconnect 102, an underfill 104, a projection 106, and an integrated circuit 108. Located between a projection sidewall 110 and an integrated circuit sidewall 112 of the integrated circuit 108 is one or more of the protruding interconnect 102. By way of example, the protruding interconnect 102 can include solder balls or solder posts. However, the protruding interconnect 102 is not limited to such interconnect technology and can include pins, or other surface mount technology, such as solder bumps. Generally, the protruding interconnect 102 provides an electrical interconnection point between the integrated circuit packaging system 100 and overlying electrical circuits.

Generally, the protruding interconnect 102 can be formed in a uniform or random pattern around all or part of the integrated circuit 108 depending on the desired density of interconnection between the integrated circuit packaging system 100 and overlying chips, packages, devices, or a combination thereof. It is to be understood that the number, size, shape, orientation, or configuration of the protruding interconnect 102 depicted is exemplary. For example, the protruding interconnect 102 can include any number of curvilinear or rectilinear shapes with or without uniform densities or configurations.

Generally, the protruding interconnect 102 can be formed in a landing pad area 114. The landing pad area is defined as the area between the projection sidewall 110 and the integrated circuit sidewall 112. The landing pad area 114 is named as such because it is the area in which electrical interconnects from overlying devices or packages will "land" upon electrical connection to the integrated circuit packaging system 100.

Generally, the underfill 104 can be formed around and under the integrated circuit 108. In at least one embodiment, the underfill 104 is bounded along the outer portion of the integrated circuit packaging system 100 by the projection 106.

The underfill 104 can differ from conventional molding compounds or conventional encapsulation materials because the CTE of the underfill 104 is higher. Additionally, it is believed that conventional molding compounds or conventional encapsulation materials cannot be used for the underfill 104 because they would exhibit adhesion or contact problems, as well as, film assist mold problems.

Additionally, conventional molding compounds or conventional encapsulation materials differ from the underfill 104 due to working temperature and cure temperature differences. For example, conventional molding compounds or conventional encapsulation materials possess working temperatures and cure temperatures of about 175° C.; whereas, the underfill 104 possesses a working temperature of about 100° C. and a cure temperature of about 160° C. As such, the underfill 104 of the present embodiments reduces the incidences of warping of the integrated circuit packaging system 100 because the underfill 104 can be processed at a lower temperature than conventional molding compounds or conventional encapsulation materials.

In yet other embodiments, the material 104 may include a particle size of about ten (10) micrometers and below, a viscosity of about seventy percent (70%) and below, or a combination thereof. Additionally, the filler loading content of the material 104 can be chosen to affect CTE, viscosity, flowability, or a combination thereof.

In at least one embodiment, the underfill 104 is not formed over the projection 106.

The projection 106 can be formed as a continuous and uninterrupted wall along a perimeter 116 of integrated circuit packaging system 100. Generally, the length of the projection sidewall 110 can be substantially equal to the length of a corresponding side of the integrated circuit packaging system 100. However, it is to be understood that the length of the projection 106 is not to be limited to the preceding example and can include any length less than, equal to, or in excess of the corresponding side length dimension of the integrated circuit packaging system 100.

The projection 106 can act as a dam to prevent the flow of the underfill 104 beyond the perimeter 116 of the integrated circuit packaging system 100.

Generally, the integrated circuit 108 can be substantially centered within the integrated circuit packaging system 100, but is not required to be and can include an offset configuration as well.

The integrated circuit 108 can include one or more active devices, passive devices, or a combination thereof, vertically stacked or located within the same plane. By way of example, and not by way of limitation, the integrated circuit 108 can include one or more semiconductor chips or die that transmit, receive, modulate, or alter electrical signals, such as stacked devices, modular devices, ASIC devices, memory devices, RF devices, analog devices, or a combination thereof.

In other embodiments, the integrated circuit 108 can further include, by way of example and not by way of limitation, one or more integrated circuit packages that transmit, receive, modulate, or alter electrical signals, such as leaded and non-leaded packages, internal stacking module packages, flip-chip packages, modular packages, application-specific-integrated-circuit (ASIC) packages, RF packages, analog packages, memory packages, stacked die packages or a combination thereof.

As such, it is to be understood that the integrated circuit 108 covers a wide range of semiconductor chip and integrated circuit package configurations involving various sizes, dimensions, and functional applications, and the type of chip or package configuration employed should only be limited by the design specifications of the integrated circuit packaging system 100.

Moreover, the present embodiments permit the testing of the integrated circuit 108 before placing it within the integrated circuit packaging system 100, thereby ensuring the use of known good die or packages in the manufacturing process. Additionally, after completing the integrated circuit packaging system 100, this assembly can also be tested before incorporation into additional package systems. This ensures that the final product includes known good assemblies, thereby improving the manufacturing process yield for the integrated circuit packaging system 100.

Figure 2:
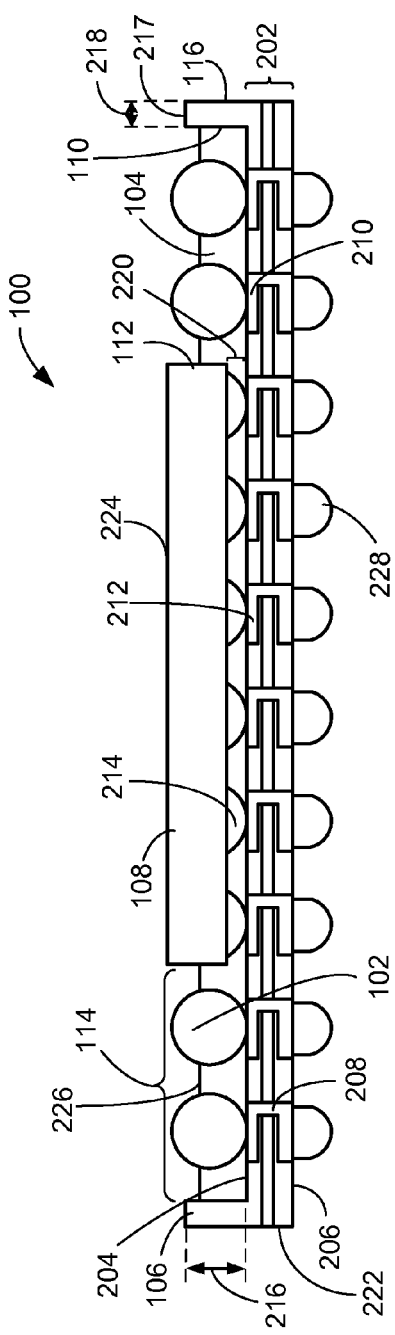
FIG. 2 is a cross sectional view of the integrated circuit packaging system along a line segment 2-2 of FIG. 1.

Referring now to FIG. 2, therein is shown a cross sectional view of the integrated circuit packaging system 100 along a line segment 2-2 of FIG. 1. Generally, the integrated circuit packaging system 100 includes the substrate 202 suitable for electrically interconnecting integrated circuit systems formed on or above the substrate 202 to external electrical circuits. The term "substrate" is used herein to mean a printed circuit board (PCB), a leadframe, a carrier substrate, an interposer, a semiconductor substrate with electrical interconnections, a ceramic substrate, a wafer-level packaging substrate, a multilayer structure (e.g., a laminate with one or more conductive layers separated by an insulator), or a combination thereof. However, although the term "substrate" is to be construed broadly, the term "substrate" does not include an integrated circuit chip or die.

Generally, the substrate 202 can include a first surface 204 (e.g., a substrate top surface) within a different plane and opposing a second surface 206 (e.g., a substrate bottom surface). A substrate via 208, which can include a combination of traces, conductive through holes, or redistribution layers, can provide an electrical connection between the first surface 204 and the second surface 206 of the substrate 202. The substrate via 208 terminating at the first surface 204 can electrically connect to one or more of a conductive pad 210 formed in a pre-selected pattern within the landing pad area 114. Generally, each of the conductive pad 210 is configured to correspond with one of the protruding interconnect 102. The conductive pad 210 and the protruding interconnect 102 can provide an electrical connection to overlying electrical devices, such as a top package.

As with the protruding interconnect 102, the conductive pad 210 can be located between the projection sidewall 110 and the integrated circuit sidewall 112.

The substrate via 208 terminating at the first surface 204 can also electrically connect to one or more of a device pad 212 formed in a pre-selected pattern to correspond with the electrical connection configuration of an overlying device, such as the integrated circuit 108. In such cases, the integrated circuit 108 can be mounted over or directly on the device pad 212 by a solder bump 214. In at least one embodiment, the integrated circuit 108 can be described as being mounted over or on the first surface 204 of the substrate 202 inward of the conductive pad 210 and over the device pad 212.

In another embodiment, the integrated circuit 108 can include a flip-chip die electrically attached to the substrate 202 by electrical interconnects, such as a solder paste or ball, for example. As such, the embodiments described herein embrace electrically connecting the integrated circuit 108 to the substrate 202 by all known ball grid array and land grid array contact techniques.

In at least one embodiment, each of the device pad 212 can be formed between the integrated circuit 108 and the substrate 202. Generally, the conductive pad 210 and the device pad 212 can be formed over, on, or directly on the substrate 202. The conductive pad 210 and the device pad 212 can be solder mask defined, non-solder mask defined, or covered with a solder-on-pad finish.

The underfill 104 can include an epoxy of resin, with a coefficient of thermal expansion (CTE) substantially similar to the integrated circuit 108 and a substrate 202. As such, the underfill 104 can help to reduce CTE stresses, promote adhesion between the substrate 202 and the integrated circuit 108, prevent moisture contamination or be sufficiently rigid to prevent warping of the substrate 202 or the integrated circuit packaging system 100 during later processing steps. Additional properties of the underfill 104 can help to protect the solder bump 214 between the substrate 202 and the integrated circuit 108 from moisture, contamination, and delamination. In at least one embodiment, the underfill 104 can be a material whose coefficient of thermal expansion is chosen to minimize the thermal mismatch between the substrate 202 and the integrated circuit 108.

It has been discovered that the underfill 104 can form a rigid support layer over the integrated circuit packaging system 100 after a sufficient cure time. By forming the underfill 104 with a uniform height, the underfill 104 provides a rigid support layer that helps to prevent warping of the substrate 202 or the integrated circuit packaging system 100 during later processing steps. The term "uniform height" is used herein to mean an unvarying distance as measured vertically upwards from the horizontal first surface 204 or top surface of the substrate 202 to a top surface 226 of the underfill 104. By preventing the warpage so common to packaging structures, the electrical pathways between adjacent structures can be improved and the incidence of device or package malfunction, due to failed interconnections, can be prevented. Accordingly, the present embodiments enhance the quality and durability of the interconnections between adjacent packages.

The projection 106, located along the perimeter 116 of the substrate 202, can include a raised portion of material. The projection 106 can be formed as a continuous and uninterrupted wall along a perimeter 116 of the substrate 202 or the integrated circuit packaging system 100. The projection 106 can act as a dam to prevent the flow of the underfill 104 beyond the perimeter 116 of the integrated circuit packaging system 100 by extending above the surface of the substrate 202.

The projection 106 can be made from any material that prevents the flow of underfill, such as solder resist, polymeric material, metal, semiconducting material, dielectric material, or a combination thereof. In at least one embodiment, the strength of the material used to form the projection 106 can provide further mechanical or structural support to the substrate 202 and help prevent subsequent warping during cure of the underfill 104 or reflow of the protruding interconnect 102.

Generally, the projection 106 can be manufactured directly on the substrate 202 or it can be fabricated separately from the substrate 202 and secured thereto by an adhesive. In at least one embodiment, the projection 106 is attached to the first surface 204 of the substrate 202 by an adhesive. In another embodiment, the projection 106 can be formed from material of the substrate 202 turned upwards with respect to the first surface 204.

The projection 106 can be formed as a single, continuous exterior boundary wall that is formed adjacent and not over the protruding interconnect 102 or the integrated circuit 108. In another embodiment, the projection 106 can be formed as a continuous structure that is integral with the substrate 202. The projection 106 is depicted as rectangular in shape but is not limited to such shape and can include any rectilinear or curvilinear shape. In at least one embodiment, the projection sidewall 110 located along the perimeter 116 of the integrated circuit packaging system 100 can be coplanar or substantially coplanar with a substrate sidewall 222.

Generally, a height 216 of the projection is less than a height of the protruding interconnect 102 or a height of the integrated circuit 108. The term "height of the projection" is used herein to mean a distance as measured vertically upwards from the horizontal first surface 204 or top surface of the substrate 202 to a projection top surface 217. However, in other embodiments, the height 216 of the projection 106 can be equal to, substantially equal to, or greater than the height of either the protruding interconnect 102 or the integrated circuit 108. In at least one embodiment, the uniform height of the underfill 104 is less than the height 216 of the projection 106.

Generally, a width 218 of the projection 106 is less than the height 216 of the projection 106, thereby providing additional space for the protruding interconnect 102 and a corresponding increase in the number of input/output connections to the integrated circuit packaging system 100.

In at least one embodiment, the projection 106 permits the underfill 104 to be deposited or dispensed with a uniform height across the entirety of the first surface 204 (e.g., from the center of the integrated circuit packaging system 100 to the projection sidewall 110). In such cases, the height of the underfill 104 can be equal to or substantially equal to about a standoff height 220 of the integrated circuit 108 across the entirety of the first surface 204 (i.e., the height of the underfill 104 under the integrated circuit 108 is equal to or substantially equal to the height of the underfill 104 in the landing pad area 114). The standoff height 220 is defined to be substantially equal or equal to the distance between the bottom of the integrated circuit 108 and the first surface 204 of the substrate 202. It has been discovered that such a uniform height of the underfill 104 dispensed across the entirety of the first surface 204 can provide structural support to the substrate 202, as well as, provide a substantially uniform collapse for each of the protruding interconnect 102.

In other embodiments, the height of the underfill 104 in the landing pad area 114 can vary from about the standoff height 220 to about the height of an integrated circuit top surface 224. In such cases, the underfill 104 can still possess a uniform height across the entirety of the landing pad area 114. However, in some embodiments, the height of the underfill 104 should not exceed the height of the protruding interconnect 102 so as to completely cover the protruding interconnect 102. In yet other embodiments, the underfill 104 does not completely cover the integrated circuit 108, thereby exposing the integrated circuit 108 from the underfill 104. It has been discovered that such a uniform height of the underfill 104 dispensed within the landing pad area 114 can provide structural support to the substrate 202, as well as, provide a substantially uniform collapse for each of the protruding interconnect 102.

In at least one embodiment, the underfill 104 does not form a fillet around the integrated circuit 108 but fills the entire void space around the integrated circuit 108 (e.g., the landing pad area 114) with a uniform height. In doing so, the underfill 104 fills between and around each of the protruding interconnect 102, thereby exposing a substantially similar or equal portion of each of the protruding interconnect 102 to the external environment. By exposing a substantially similar or equal portion of each of the protruding interconnect 102 from the underfill 104, the underfill 104 can help to prevent unequal solder ball collapse during attachment of an overlying device or package.

In at least one embodiment, the underfill 104 includes the top surface 226 that can be planar or substantially planar, wherein each of the protruding interconnect 102 protrudes or extends substantially the same distance above the top surface 226 of the underfill 104. In at least one embodiment, the projection 106 permits the top surface 226 of the underfill 104 to form a planar or substantially planar surface by acting as a dam for the underfill 104.

In another embodiment, it has been discovered that the projection 106 permits the underfill 104 to be dispensed with a uniform volume across the entirety of the first surface 204 (e.g., from the center of the integrated circuit packaging system 100 to the projection sidewall 110).

The term "uniform volume" is defined herein to mean the amount of space, measured in three dimensions, that an unvarying quantity of the underfill 104 occupies. It is to be understood that the volume of the underfill 104 is uniform because: 1) opposing sides, adjacent sides, or a combination thereof, of the landing pad area 114 can possess substantially equal filled volumes; or 2) the landing pad area 114 and the space between the integrated circuit 108 and the substrate 202 can possess substantially equal filled volumes.

It has been discovered that such a uniform volume of the underfill 104 dispensed across the entirety of the first surface 204 can provide structural support to the substrate 202, as well as, provide a substantially uniform collapse for each of the protruding interconnect 102.

In yet other embodiments, the height of the underfill 104 in the landing pad area 114 can vary from about the standoff height 220 to about the height of the integrated circuit top surface 224. In such cases, the underfill 104 can still possess a uniform volume across the entirety of the landing pad area 114. It has been discovered that such a uniform volume of the underfill 104 dispensed within the landing pad area 114 can provide structural support to the substrate 202, as well as, provide a substantially uniform collapse for each of the protruding interconnect 102.

It has been discovered that the uniform height or the uniform volume of the underfill 104 formed over the substrate 202 helps to maintain coplanarity or planarity of the substrate 202 during attachment of an overlying device or package to the integrated circuit packaging system 100 because the underfill 104 acts to stabilize the substrate 202 and prevent deflection of the substrate 202.

It has been discovered that the projection 106 can also help to prevent overflow or bleed out of the underfill 104 from or to an adjacent package, thereby preventing unwanted covering of electrical circuits or landing pads formed on the first surface 204 of the substrate 202.

In at least one embodiment, the underfill 104 can be formed around the integrated circuit 108, as well as, between the integrated circuit 108 and the substrate 202.

Additionally, it has been discovered that unequal solder ball collapse during attachment of an overlying device has been cured because the exposed solder ball volume is now the same due to the uniform height or uniform volume of the underfill 104. Since the uniform height or the uniform volume of the underfill 104 surrounding each of the protruding interconnect 102 is the same, the collapse for each of the protruding interconnect 102 can be substantially the same.

The integrated circuit packaging system 100 can also include an external connector 228 formed on the second surface 206 of the substrate 202 for providing connection to external circuits. In another embodiment, the external connector 228 can include one or more of a solder ball that forms, for example, a ball grid array. Although the present embodiment depicts the external connector 228 as a solder bump, it is to be understood that the external connector 228 can include any interface connection technology, such as a pin or land grid array that establishes electrical contact between the integrated circuit packaging system 100 and other external electrical circuits.

At this stage, the integrated circuit packaging system 100 can be encapsulated to form a discrete, complete package or the integrated circuit packaging system 100 can be utilized within other package systems, such as package-on-package systems.

Figure 3:
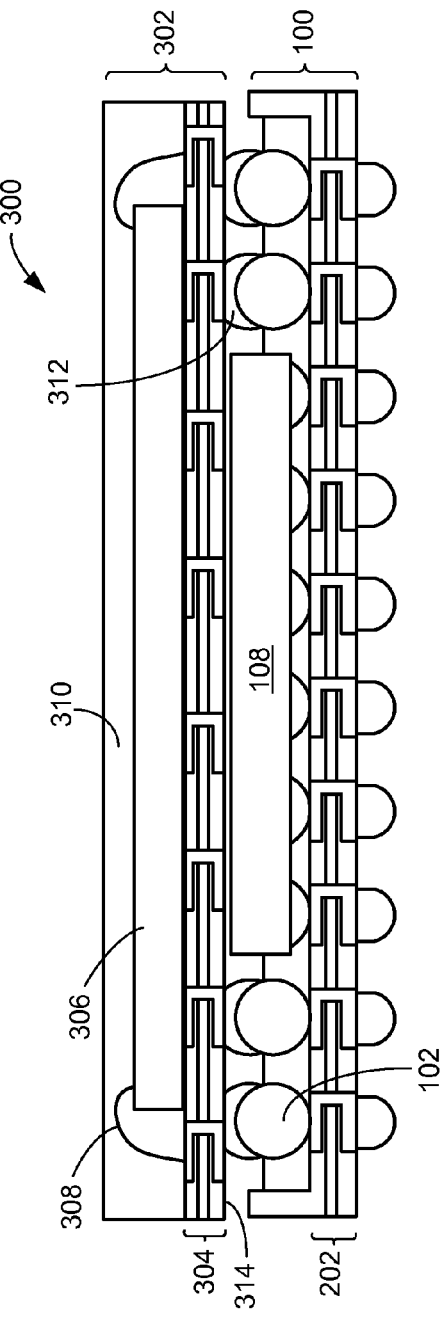
FIG. 3 is a cross sectional view of an integrated circuit packaging system in a second embodiment of the present invention.

Referring now to FIG. 3, therein is shown a cross sectional view of an integrated circuit packaging system 300 in a second embodiment of the present invention. In at least one embodiment, the integrated circuit packaging system 300 can include a package-on-package configuration. In such cases, the integrated circuit packaging system 100 can be referred to as a bottom package, a base package or a first package.

Formed over the integrated circuit packaging system 100 is a device 302, such as an integrated circuit, die, chip, integrated circuit package or other electronic circuit including both passive and active components. In at least one embodiment, the device 302 can be referred to as a top package; however, other electronic circuits or other packages can be formed over the device 302 as required by the design specifications of the integrated circuit packaging system 300.

Generally, the device 302 can include a substrate 304 similar to the substrate 202, of FIG. 2, and an integrated circuit 306 similar to the integrated circuit 108, of FIG. 1. In at least one embodiment, the integrated circuit 306 can be electrically connected to the substrate 304 by a wire bond 308; however, it is to be understood that other electrical connections can be utilized, such as flip-chip bonding.

In some embodiments, the device 302 can include an encapsulation material 310 formed over or on the substrate 304 and the integrated circuit 306. The encapsulation material 310 and molding techniques using it are well known in the art and not repeated herein.

An external connection 312 can electrically connect the device 302 to the protruding interconnect 102 of the integrated circuit packaging system 100. The external connection 312 can be formed on a bottom surface 314 of the substrate 304 with a configuration substantially similar to the configuration of the protruding interconnect 102. In at least one embodiment, the external connection 312 can be a solder bump or a solder ball, for example. In such cases, the device 302 can be adhered to the integrated circuit packaging system 100 by reflowing the external connection 312 and the protruding interconnect 102 to form the integrated circuit packaging system 300 as a PoP structure. Additionally, flux material can be deposited to improve wetting of the external connection 312 and the protruding interconnect 102 during attachment of the device 302 to the integrated circuit packaging system 100.

FIGS. 4-8 depict a process flow for the formation of the integrated circuit packaging system 100 within FIGS. 1-3. Accordingly, FIGS. 4-8 include some of the same reference numbers used to describe the integrated circuit packaging system 100 in FIGS. 1-3. It is noted that the layers, structures, and process steps corresponding to such reference numbers generally include the same characteristics (e.g., composition, thickness, function, process techniques, etc.) as those described in reference to FIGS. 1-3 and, therefore, their descriptions are not reiterated in detail for FIGS. 4-8. Rather the descriptions of the layers, structures, and process steps corresponding to reference numbers in FIGS. 1-3 are incorporated for the same reference numbers included in FIGS. 4-8.

Referring now to FIG. 4, therein is shown a cross-sectional view of the integrated circuit packaging system 100 in an initial stage of manufacture. The substrate 202 includes the substrate via 208, the conductive pad 210, the device pad 212, and the projection 106. The substrate via 208 terminating at the first surface 204 can electrically connect to one or more of the conductive pad 210. The conductive pad 210 can provide an electrical connection point for circuits within the substrate 202 and an overlying electrical device, such as a top package.

The substrate via 208 terminating at the first surface 204 can also electrically connect to one or more of the device pad 212 formed in a pre-selected pattern to substantially correspond with the electrical connection configuration of an overlying device, such as the integrated circuit 108, of FIG. 1.

Generally, the projection 106 acts as a dam or wall to prevent the flow of underfill beyond the perimeter 116 of the integrated circuit packaging system 100 by extending above the first surface 204 of the substrate 202. In at least one embodiment, the projection 106 can be designed (e.g., by choosing sufficiently rigid materials or structurally continuous configurations) to provide mechanical or structural support to the substrate 202, thereby helping to prevent warping of the substrate 202 during subsequent processing.

Referring now to FIG. 5, therein is shown a cross-sectional view of the integrated circuit packaging system 100 of FIG. 4 after adhering the protruding interconnect 102. Generally, the protruding interconnect 102 can be formed over or on the conductive pad 210 in the landing pad area 114 between the projection 106 and the integrated circuit 108 (not shown). In at least one embodiment, the protruding interconnect 102 can include a solder ball.

Referring now to FIG. 6, therein is shown a cross-sectional view of the integrated circuit packaging system 100 of FIG. 5 after adhering the integrated circuit 108. The integrated circuit 108 can be formed inward of the projection 106 and inward of the protruding interconnect 102. In at least one embodiment, the integrated circuit 108 can be surrounded on one or more sides (e.g., the integrated circuit sidewall 112) by the protruding interconnect 102 and the projection 106.

In at least one embodiment, the integrated circuit 108 can include a flip-chip device that is electrically connected to the device pad 212 on the first surface 204 of the substrate 202 by the solder bump 214.

Figure 7:
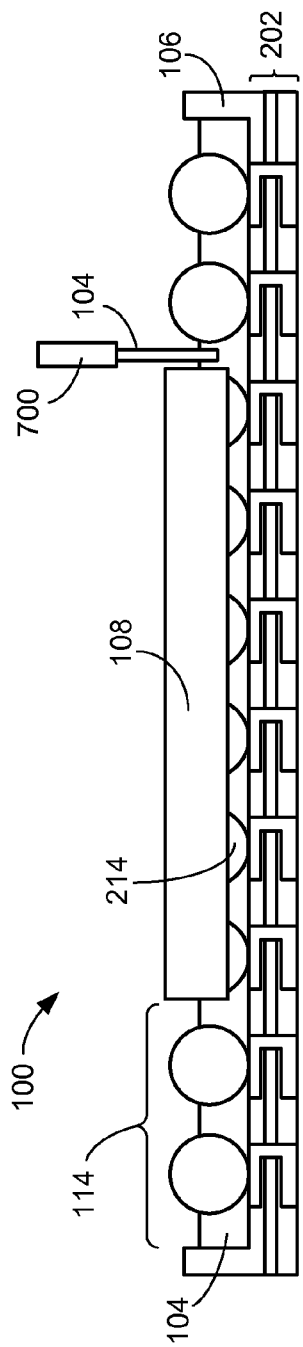
FIG. 7 is a cross-sectional view of the integrated circuit packaging system of FIG. 6 during deposition of the underfill.

Referring now to FIG. 7, therein is shown a cross-sectional view of the integrated circuit packaging system 100 of FIG. 6 during deposition of the underfill 104. In at least one embodiment, a dispensing device 700, such as a needle, can be used to deposit the underfill 104 in one or more locations, either simultaneously or sequentially, over or on the substrate 202.

The viscosity of the underfill 104 can be chosen to permit the underfill 104 to flow laterally between the integrated circuit 108 and the substrate 202 by capillary action or wicking of the underfill 104 to completely encapsulate each of the solder bump 214. In such cases, the underfill 104 can be applied as a capillary underfill material between a connected configuration of the substrate 202 and the integrated circuit 108. However, other dispensing methods can also be employed, such as pressure induced dispensing of the underfill 104. Generally, the underfill 104 helps to protect the solder bump 214 from moisture, contamination, or delamination stresses between the integrated circuit 108 and the substrate 202.

In at least one embodiment, the projection 106 permits the underfill 104 to disperse evenly and with a uniform height over the substrate 202 in the landing pad area 114. It is to be understood that the landing pad area 114 can be formed around one or more sides, including all sides, of the integrated circuit 108.

Figure 8:
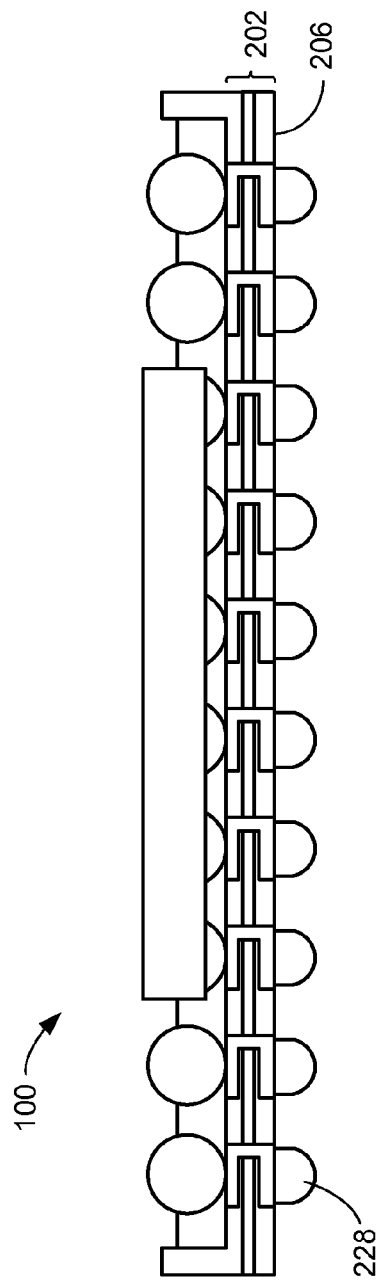
FIG. 8 is a cross-sectional view of the integrated circuit packaging system of FIG. 7 during attachment of the external connector.

Referring now to FIG. 8, therein is shown a cross-sectional view of the integrated circuit packaging system 100 of FIG. 7 during attachment of the external connector 228. In at least one embodiment, the external connector 228 can be formed on the second surface 206 of the substrate 202. Generally, the external connector 228 can include any electrical interconnection structure that facilitates the incorporation of the integrated circuit packaging system 100 into a higher-level assembly, such as a printed circuit board or other suitable structure for supporting or electrically interfacing with the integrated circuit packaging system 100.

Figure 9:
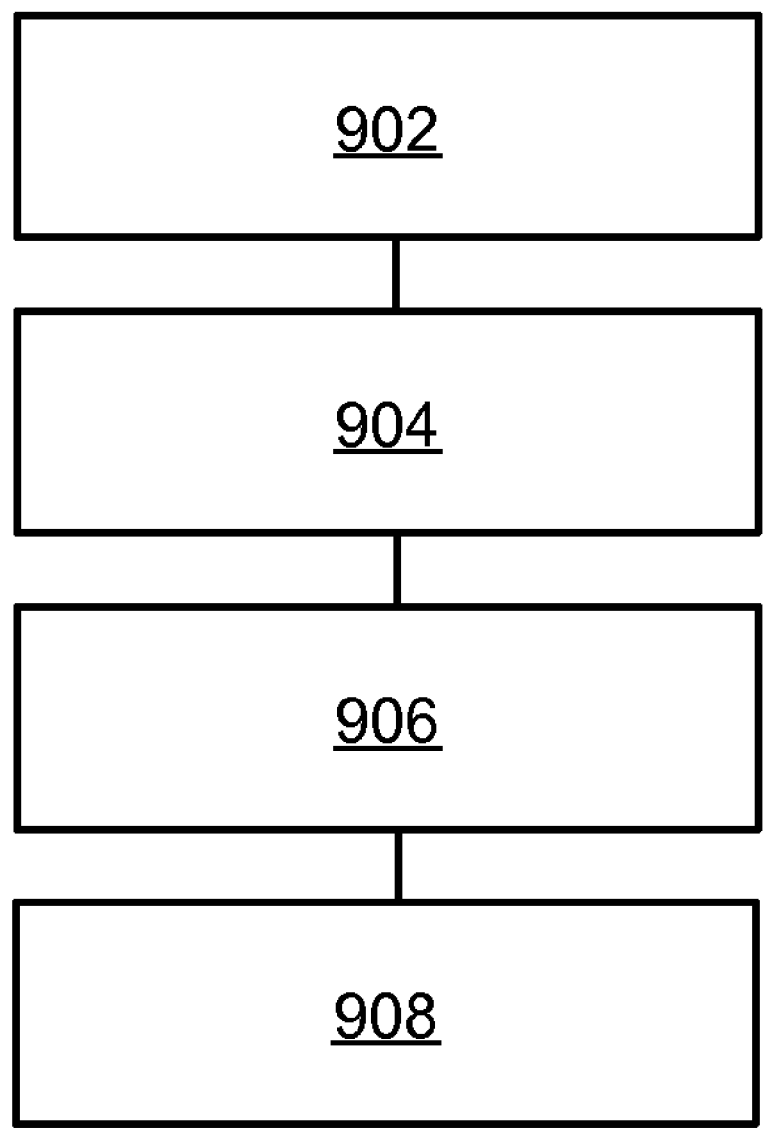
FIG. 9 is a flow chart of a method of manufacture of an integrated circuit packaging system in an embodiment of the present invention.

Referring now to FIG. 9, therein is shown a flow chart of a method 900 of manufacture of an integrated circuit packaging system in an embodiment of the present invention. The method 900 includes: providing a substrate with a projection formed along a perimeter of a first surface of the substrate in a block 902; mounting an integrated circuit over the first surface in a block 904; forming a protruding interconnect over the first surface between the projection and the integrated circuit in a block 906, and forming an underfill between the integrated circuit and the projection with a uniform height, the uniform height of the underfill less than a height of the projection in a block 908.

It has been discovered that one of the major disadvantages of current technology is that only the area directly around the die or chip is molded or filled with an underfill material, leaving the outer perimeter regions of the substrate exposed. These exposed outer perimeter substrate regions, which contain electrical connection sites, solder balls, and no molding compound or little underfill material, are subject to warpage after ball mount and reflow. The warpage of the substrate or package arises due to the differences in thermal expansion between the semiconductor chip, the substrate, the solder balls, and the underfill material. It has been unexpectedly found that warpage of the bottom substrate of a PoP occurs during curing of the underfill material or during reflow of the solder interconnects due to the non-uniform distribution of underfill material across the entire bottom substrate.

It has been discovered that a uniform height or a uniform volume of the underfill formed over the substrate helps to prevent warpage of the substrate and package due to the mechanical and structural support provided by the underfill.

It has been discovered that a uniform height or a uniform volume of the underfill formed over the substrate helps to maintain the planarity of the substrate due to the mechanical and structural support provided by the underfill.

It has been discovered that the projection can help to prevent the overflow of underfill into adjacent chip, device, or package structures.

It has been discovered that the uniform height or the uniform volume of the underfill formed over the substrate helps to produce a uniform solder ball collapse across the substrate.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate with a projection formed along a perimeter of a first surface of the substrate;
   mounting an integrated circuit over the first surface;
   forming a protruding interconnect over the first surface between the projection and the integrated circuit; and
   forming an underfill between the integrated circuit and the projection with a uniform height, the uniform height of the underfill less than a height of the projection.

2. The method as claimed in claim 1 wherein:
   providing the substrate with the projection includes providing a projection sidewall substantially coplanar with a substrate sidewall.

3. The method as claimed in claim 1 wherein:
   providing the integrated circuit includes providing a flip-chip.

4. The method as claimed in claim 1 further comprising:
   exposing a substantially equal portion of each of the protruding interconnect from the underfill.

5. The method as claimed in claim 1 wherein:
   forming the underfill includes exposing the integrated circuit from the underfill.

6. A method of manufacture of an integrated circuit packaging system comprising:
   providing a substrate with a projection formed along a perimeter of a first surface of the substrate;
   mounting an integrated circuit over the first surface;
   forming a protruding interconnect over the first surface between the projection and the integrated circuit;
   forming an underfill between the integrated circuit and the projection with a uniform height, the uniform height of the underfill less than a height of the projection; and
   attaching a device over the integrated circuit by electrically connecting an external connection of the device to the protruding interconnect.

7. The method as claimed in claim 6 wherein:
   providing the substrate with the projection includes forming the projection as a continuous structure.

8. The method as claimed in claim 6 wherein:
   providing the substrate with the projection includes forming the projection integral with the substrate.

9. The method as claimed in claim 6 wherein:
   attaching the device includes attaching an integrated circuit package.

10. The method as claimed in claim 6 wherein:
    attaching the device includes forming a package-on-package structure.

11. An integrated circuit packaging system comprising:
a substrate with a projection along a perimeter of a first surface of the substrate;
an integrated circuit over the first surface of the substrate and attached thereto;
a protruding interconnect over the first surface between the projection and the integrated circuit; and
an underfill between the integrated circuit and the projection with a uniform height, the uniform height of the underfill less than a height of the projection.

12. The system as claimed in claim 11 further comprising:
a projection sidewall substantially coplanar with a substrate sidewall.

13. The system as claimed in claim 11 wherein:
the integrated circuit includes a flip-chip.

14. The system as claimed in claim 11 wherein:
the underfill exposes a substantially equal portion of each of the protruding interconnect.

15. The system as claimed in claim 11 wherein:
the integrated circuit is exposed from the underfill.

16. The system as claimed in claim 11 further comprising:
a device over the integrated circuit, the device including an external connection electrically connected to the protruding interconnect.

17. The system as claimed in claim 16 wherein:
the projection includes a continuous structure.

18. The system as claimed in claim 16 wherein:
the projection is integral with the substrate.

19. The system as claimed in claim 16 wherein:
the device includes an integrated circuit package.

20. The system as claimed in claim 16 wherein:
a width of the projection is less than the height of the projection.

* * * * *